(12) United States Patent
Sedigh et al.

(10) Patent No.: US 7,323,377 B1
(45) Date of Patent: Jan. 29, 2008

(54) INCREASING SELF-ALIGNED CONTACT AREAS IN INTEGRATED CIRCUITS USING A DISPOSABLE SPACER

(75) Inventors: Mehran Sedigh, San Jose, CA (US); Manuj Rathor, Milpitas, CA (US); Alain P. Blosse, Belmont, CA (US); Dutta Saurabh Chowdhury, Farmers Branch, TX (US)

(73) Assignee: Cypress Semiconductor Corporation, San Jose, CA (US)

( * ) Notice: Subject to any disclaimer, the term of this patent is extended or adjusted under 35 U.S.C. 154(b) by 286 days.

(21) Appl. No.: 11/089,732

(22) Filed: Mar. 25, 2005

Related U.S. Application Data

(60) Provisional application No. 60/557,077, filed on Mar. 26, 2004.

(51) Int. Cl.
*H01L 21/336* (2006.01)

(52) U.S. Cl. ............... 438/197; 438/299; 257/E21.435; 257/E21.632

(58) Field of Classification Search ................ 438/197, 438/270, 299, 268, 303; 257/E21.435, E21.632
See application file for complete search history.

(56) References Cited

U.S. PATENT DOCUMENTS

| | | | |
|---|---|---|---|
| 4,885,617 A | 12/1989 | Mazure-Espejo et al. | |
| 5,102,816 A | 4/1992 | Manukonda et al. | |
| 5,798,278 A | 8/1998 | Chan et al. | |
| 5,804,846 A | 9/1998 | Fuller | |
| 5,905,293 A | 5/1999 | Jeng et al. | |
| 6,027,961 A | 2/2000 | Maiti et al. | |
| 6,228,731 B1 | 5/2001 | Liaw et al. | |
| 6,670,227 B1 * | 12/2003 | Thio et al. | 438/201 |
| 6,724,057 B2 | 4/2004 | Ibara et al. | |
| 6,746,926 B1 * | 6/2004 | Yu | 438/291 |
| 2002/0197786 A1 * | 12/2002 | Cho et al. | 438/238 |
| 2003/0087517 A1 * | 5/2003 | Lee | 438/637 |

OTHER PUBLICATIONS

John Gumpher, et al. "Characterization of Low-Temperature Silicon Nitride LPCVD from Bis (tertiary-butylamino) silane and Ammonia" Mar. 26, 2004, pp. G353-G359, Journal of the Electrochemical Society.

Chang, Hsiao-Yung "Modeling and Simulation of a Tungten Chemical Vapor Deposition Reactor" Aug. 1, 2000 (Abstract) pp. 1-154, University of Maryland, College Park.

(Continued)

*Primary Examiner*—Walter L Lindsay, Jr.
(74) *Attorney, Agent, or Firm*—Okamoto & Benedicto LLP

(57) ABSTRACT

In one embodiment, a method of fabricating an integrated circuit includes the steps of: (i) forming composite spacers on sidewalls of a transistor gate, each of the composite spacers comprising a first liner having a stepped portion and a disposable spacer material over the stepped portion; (ii) forming a source/drain region by performing ion implantation through a portion of the first liner over the source/drain region; (iii) replacing the disposable spacer material with a second liner formed over the first liner after forming the source/drain region; (iv) forming a pre-metal dielectric over the second liner; and (v) forming a self-aligned contact through the pre-metal dielectric. Among other advantages, the method allows for an increased contact area for a self-aligned contact.

18 Claims, 5 Drawing Sheets

OTHER PUBLICATIONS

Sato, Yasuhiro, et al. "300-kilo gate sea-of-gate arrays . . ." Aug. 10, 1998; accepted Sep. 17, 1998, Abstract [online] Japanese Journal of Applied Physics; [retrieved on Feb. 12, 2002] Retrieved from Online Journal Publishing Service (OJPS).

Chang, Kow-Ming, et al. "Characteristics of Selective Chemical Vapor Deposition of Tungsten on Aluminum with a Vapor Phase Precleaning Technology" Jan. 1997, pp. 251-258, vol. 144, No. 1; Electrochemical Society, Inc., Hsinchu, Taiwan.

Van Der Putte, P. et al. "Growth of selective tungsten films on self-aligned CoSi2 by low pressure chemical vapor deposition" Aug. 1996, accepted Oct. 1996; pp. 1723-1725, vol. 49, No. 25; Applied Physics Lett. Signetics Corporation, Sunnyvale, California.

Kosugi, Toshihiko, et al. "Novel SI Surface Cleaning Technology with Plasma Hydrogenation and Its Application to Selective CVD-W Clad Layer Formation" 1995 Symposium on VLSI Technology Digest of Technical Papers, pp. 41-42; Atsugi, Kanagawa, Japan.

Takahashi, Mitsutoshi, et al. "Si Consumption In Selective Chemical Vapor Deposition of Tungsten Using SiH4 Reduction of WF6" Jun. 16, 2000; revised manuscript Oct. 30, 2000; pp. G229-G231, Journal of the Electrochemical Society; Atsugi, Kanagawa, Japan.

Takahashi, Mitsutoshi, et al. "Fully Depleted 20-nm SOI CMOSFETs with W-Clad Gate/Source/Drain Layers" Jul. 2001, pp. 1380-1385, vol. 48 No. 7, IEEE Transactions on Electron Devices.

Chang, Kow-Ming, et al. "Interface Characteristics of Selective Tungsten on Silicon Using a New Pretreatment Technology for ULSI Application" May 1997, pp. 738-743, vol. 44 No. 5, IEEE Transactions on Electron Devices.

B.W. Shen, et al. "Diffusion barrier properties of thin selective chemical vapor deposited tungsten films", 1996, pp. 1369-1376, vol. 4 No. 6, J. Vac. Sci. Technol.; Texas Instruments, Dallas, Texas.

Wen-Kuan Yeh, et al. "Effect of surface pretreatment of submicron contact hole on selective tungsten chemical vapor deposition" 1996, pp. 167-173, vol. 14 No. 1, J. Vac. Sci. Technol.; Hsinchu Taiwan, Republic of China.

M. Sekine, et al, "Self-Aligned Tungsten Strapped Source/Drain and Gate Technology Realizing the Lowest Sheet Resistance for Sub-quarter Micron CMOS" 1994, pp. 493-496, IEEE; NEC Corp., Kanagawa, Japan.

Blewer, Robert S "Progress in LPCVD Tungsten for Advanced Microelectronics Applications", Nov. 1986, pp. 177-126; Albuquerque, New Mexico.

Sato, Yasuhiro, et al. "300-kilo-Gate Sea-of-Gate Type Gate Arrays Fabricated Using 0.25-um-Gate Ultra-Thin-Film Fully Depleted Complementary Metal-Oxide-Semiconductor Separation by IMplanted OXygen Technology with Tungsten-Covered Source and Drain", 1998, pp. 5875-5879, vol. 37 No. 11, Japanese Journal of Applied Physics; Japan.

Kobayashi, Nobuyoshi, et al. "Study on mechanism of selective chemical vapor deposition of tungsten using in situ infrared spectroscopy and Auger electron spectroscopy", 1991, pp. 1013-1019, vol. 69, No. 2, Journal of Applied Physics; Japan.

* cited by examiner

INCREASING SELF-ALIGNED CONTACT AREAS IN INTEGRATED CIRCUITS USING A DISPOSABLE SPACER

CROSS-REFERENCE TO RELATED APPLICATION

This application claims the benefit of U.S. Provisional Application No. 60/557,077, filed on Mar. 26, 2004, which is incorporated herein by reference in its entirety.

BACKGROUND OF THE INVENTION

1. Field of the Invention

The present invention relates generally to integrated circuits, and more particularly to integrated circuit fabrication processes and structures.

2. Description of the Background Art

Developments in semiconductor processing in recent years have steadily decreased the size of features or elements in integrated circuits (ICs). It is expected that this trend will continue for at least the foreseeable future. In particular, self-aligned contacts (SAC) are increasingly used to contact source and drain regions in Field Effect Transistors (FET) to shrink the size of the devices and increase device performance. In particular, Static Random Access Memories (SRAM) and Dynamic Random Access Memories (DRAM) rely heavily on SAC processes to shrink cell sizes, thereby enabling larger memory sizes and lower cost per bit.

Briefly, a conventional SAC process involves forming a SAC opening through a pre-metal dielectric (PMD), and filling the SAC opening with a metal to electrically couple with an active or diffusion region of a device, such as a source/drain region in a FET. Generally, the SAC opening is formed near or immediately adjacent to a SiN spacer surrounding a gate of the FET.

There are several problems associated with conventional SAC processes. These problems include the sloping shape and thickness of the SiN spacer that is necessary to protect the gate from electrically shorting to the metal of the SAC. The thickness of this spacer reduces the bottom critical dimension (CD) or contact area for the SAC, and, because the devices must be spaced further apart to provide a sufficient contact area, restricts a minimum spacing between the devices. In addition to spacer formation, a conformal etch stop layer that also serves as a liner (usually SiN) is deposited on top of the source/drain regions as well as all around the spacer and gate. The role of the liner is to insure that shallow trench isolation (STI) areas are not exposed to SAC etch chemistry, which due to similarity in material type (i.e., highly doped glass vs. undoped HDP $SiO_2$) does not have high selectivity. Although the liner is subsequently removed using an etch with high selectivity to both Si and SiO2, it further reduces the SAC bottom contact area due to an isotropic nature of the etch, exacerbating the problem with SAC contact areas and/or spacing between devices.

An alternative known SAC process uses a single SiN spacer without a SiN liner and highly doped phosphosilicate glass (PSG) (~9%) as PMD with $C_2H_2F_4$ chemistry to form heavy polymers and stop on undoped $SiO_2$. Although an improvement over the conventional SAC process, the above approach is not wholly satisfactory for a number of reasons. One reason is that this approach has an even greater susceptibility to profile tapering or sloped spacers, thereby offsetting some of the gain in contact area achieved by the elimination of a liner especially as contact critical dimension shrinks and aspect ratio increases.

In addition, the removal of SiN liner exposes the silicon surface during PMD high density plasma deposition which is thought to be the root cause of flower pattern, which is a silicon-rich area in a shape of a blossom around the spacer structure due to back sputter of silicon from source/drain area during HDP deposition of highly doped glass. This silicon-rich area is specifically harder to etch simply due to the fact that the chemistry used ($C_2H_2F_4$) is designed to be selective to the bottom silicon, thereby adding an extra challenge to the etch especially as the cell size shrinks and gates get closer, which may cause overlap of two adjacent flower patterns and a complete etch stop. Moreover, these become more serious problems as feature sizes sink below 130 nm.

Accordingly, there is a need for a SAC process that produces SACs having improved contact areas, or bottom critical dimensions, whereby size of the contacts and spacing between the FET devices can be reduced.

SUMMARY OF THE INVENTION

In one embodiment, a method of fabricating an integrated circuit includes the steps of: (i) providing a gate structure on a surface of a semiconductor substrate; (ii) forming a first liner on the gate structure and on the surface of the semiconductor substrate; (iii) forming a disposable spacer material overlying the first liner; (iv) etching the spacer material to form composite spacers over the gate structure and to thin portions of the first liner overlying portions of the substrate where source/drain regions will be formed; (v) implanting dopants through the thinned first liner to form source/drain regions; (vi) performing an implant anneal; (vii) removing the disposable spacer material; (viii) forming a second liner on the first liner to form an etch stop layer on the surface of the semiconductor substrate and to re-enforce the substantially rectangular or "boxy" shape of the spacers; (ix) depositing a pre-metal dielectric (PMD) layer over the second liner; (x) forming a SAC opening in said PMD layer, wherein said SAC opening stops on the second liner and thereby expose a portion of the second liner; (xi) removing the second liner and first liners to expose a portion of an active device region within said SAC opening; and (xii) filling the SAC opening with a metal to contact the SAC in the SAC opening.

In another aspect, the present invention is directed to an integrated circuit formed in accordance with the above-described method.

These and other features of the present invention will be readily apparent to persons of ordinary skill in the art upon reading the entirety of this disclosure, which includes the accompanying drawings and claims.

Figure 1:
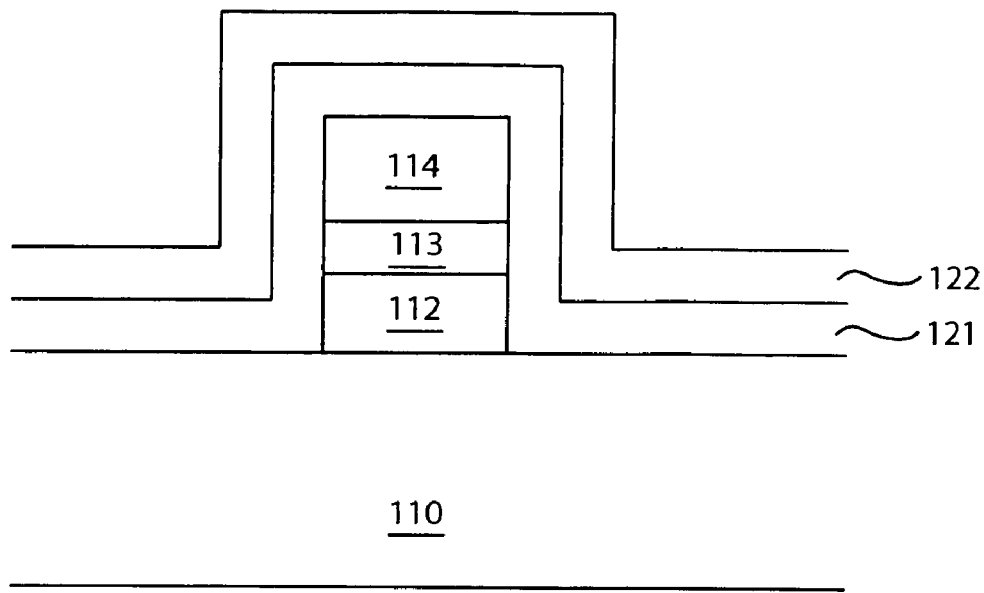
FIGS. 1-7 schematically show sectional views of an integrated circuit being fabricated in accordance with an embodiment of the present invention.

The use of the same reference label in different drawings indicates the same or like components. The drawings are not drawn to scale.

DETAILED DESCRIPTION

The present invention is directed to a novel integrated circuit fabrication process and associated structures. The novel process or method may be used in the formation of a self-aligned contact (SAC) to a device, such as a field effect transistor (FET), formed on a semiconductor substrate. The invention is particularly useful in the fabrication of a variety of devices, including Static Random Access Memories (SRAM) and Dynamic Random Access Memories (DRAM).

In one embodiment, the process involves: (i) providing a gate structure on a surface of the semiconductor substrate; (ii) forming a first silicon nitride (SiN) layer, on the gate structure and on the surface of the semiconductor substrate; (iii) forming a silicon oxide (SiO2) layer, overlying the first SiN layer; (iv) etching the SiO2 layer to form SiO2/SiN spacers over the gate structure and to completely remove the SiO2 overlying the first SiN layer on the surface of the substrate to form a thin SiN liner on the surface of the substrate; (v) implanting dopants through the thin SiN liner to form the active device region; (vi) performing an implant anneal; (vii) removing the SiO2 spacer; (viii) forming a second SiN layer on the first SiN layer to form a SiN etch stop layer on the surface of the semiconductor substrate; (ix) depositing a pre-metal dielectric (PMD) layer over the second SiN layer; (x) forming a SAC opening in said PMD layer, wherein said SAC opening stops on the second SiN layer; (xi) removing the first and second SiN layers to expose a portion of the active device region within said SAC opening; and (xii) filling the SAC opening with a metal to contact the SAC in the SAC opening.

Preferably, the steps of etching the $SiO_2$ layer to form spacers and removing the SiO2 spacers include etches having a high selectivity to SiN. For example in one embodiment, the step of etching the $SiO_2$ layer to form $SiO_2$/SiN spacers over the gate structure includes a low power main etch step utilizing $CHF_3/CF_4/Ar/O_2$ followed by an over-etch with $CO/C_4F_8/Ar$ or $C_4F_6/O_2/Ar$ to stop on the first SiN layer. Subsequent removal of the $SiO_2$ can be accomplished using wet etch chemistry (i.e., a 100:1 HF or BOE). Alternatively, the step of etching the $SiO_2$ layer to form $SiO_2$/SiN spacers over the gate structure can involve a single step of $C_4F_6/O_2/Ar$ etch stopping on the first SiN layer.

A process for forming a self-aligned contact according to an embodiment of the present invention is now described in greater detail with reference to FIGS. 1-7. For purposes of clarity, many of the details of semiconductor processing in general, and methods of patterning and etching using conventional lithographic techniques in particular, that are widely known and are not relevant to the present invention have been omitted from the following description.

Referring to FIG. 1, the process begins with deposition of a composite spacer layer. In one embodiment, the composite spacer layer includes a first liner comprising a first silicon nitride (SiN) liner 121 and a disposable spacer material comprising a $SiO_2$ layer 122. The first SiN liner 121 is deposited on a transistor gate on a surface of a semiconductor substrate 110 (e.g., silicon substrate). In the example of FIG. 1, the gate is a gate stack comprising a gate polysilicon 112, a metal 113, and a capping layer 114. A gate oxide layer (not shown) is formed between the gate polysilicon 112 and the substrate 110. In one embodiment, the gate polysilicon 112 comprises doped amorphous silicon formed to a thickness of about 800 Angstroms. The metal 113 may comprise tungsten formed to a thickness of about 400 Angstroms, while the capping 114 layer may comprise silicon nitride formed to a thickness of about 1500-2000 Angstroms. A barrier layer (not shown) comprising a bi-layer of a refractory metal (e.g., titanium, tantalum) and a refractory nitride (e.g., titanium-nitride, tantalum-nitride, tungsten-nitride) deposited to a thickness of about 50 Angstroms may be formed between the gate polysilicon 112 and the metal 113.

In one embodiment, the first SiN liner 121 is relatively thin in that it is formed to a thickness of about 50 Angstroms to about 200 Angstroms, and preferably to a thickness less than about 150 Angstroms. The thinness of the first SiN liner 121 advantageously helps increase the contact area of self-aligned contacts. The $SiO_2$ layer 122 is formed over the first SiN liner 121. In one embodiment, the $SiO_2$ layer 122 formed to a thickness of about 300-450 Angstroms.

The first SiN liner 121 may comprise low pressure chemical vapor deposition (LPCVD) di-chloro-silane (DCS) SiN or low temperature LPCVD Bis-Teritary-Butyil-Amino-Silane (BTBAS) SiN. BTBAS SiN is preferred because of its low temperature deposition due to low thermal budget requirements and extremely low etch rate during removal of the SiO2 spacer. This allows portions of the first SiN liner 121 to remain after the composite spacer formation and removal steps, allowing for subsequent implantation through the liner and maintaining its film uniformity and integrity. Low temperature LPCVD of SiN from BTBAS is also disclosed in Gumpher et. Al., "Characterization of Low-Temperature Silicon Nitride LPCVD from Bis(tertiary-butylamino)silane and Ammonia," Journal of The Electrochemical Society, 151 (5) G353-G359 (2004), incorporated herein by reference in its entirety.

Figure 2:
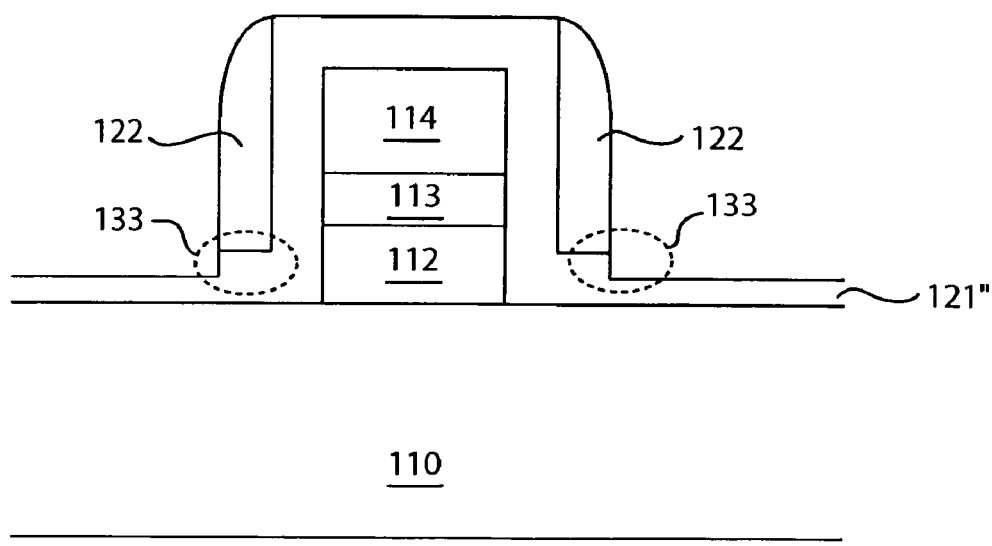

In FIG. 2, the $SiO_2$ layer 122 is etched to remove the portion of the $SiO_2$ layer 122 overlying the portion of first SiN layer 121 on the surface of substrate 110 where active regions (e.g., source/drain regions) are to be formed and to remove the portion of the $SiO_2$ layer 122 on the top surface of the gate. This forms composite SiO2/SiN spacers surrounding the sidewalls of the gate. Each composite spacer includes a stepped portion, which is generally bounded by a dashed marker 133. The stepped portions result from the thinning of the first SiN layer 121 as part of or after the etching of the $SiO_2$ layer 122. Note that the remaining portions of the $SiO_2$ layer 122 are over the stepped portions. In FIG. 2 and following figures, the first SiN layer 121 has been re-labeled as 121" to indicate that it has been thinned.

Preferably, the $SiO_2$ layer 122 is etched using an etch process having a high selectivity to SiN. By high selectivity it is meant a selectivity to SiN relative to $SiO_2$ of more than about 5:1 to 20:1. In one embodiment, the composite spacer etch is accomplished with a low power main etch step using the etchant chemistry $CHF_3/CF_4/Ar/O_2$ to a predetermined endpoint, followed by an over-etch using the etchant chemistry $CO/C_4F_8/Ar$ or $C_4F_6/O_2/Ar$ to stop on the first SiN layer 121. Alternatively, the composite spacer etch may be accomplished in a single $SiO_2$ etch step utilizing the etchant chemistry $C_4F_6/O_2/Ar$ to stop on the first SiN layer 121. Note that the first SiN layer 121 is still thinned by a few tens of Angstroms, for example, before the composite spacer etch reaches its target end point even with if the etch is highly selective to SiN.

Figure 3:
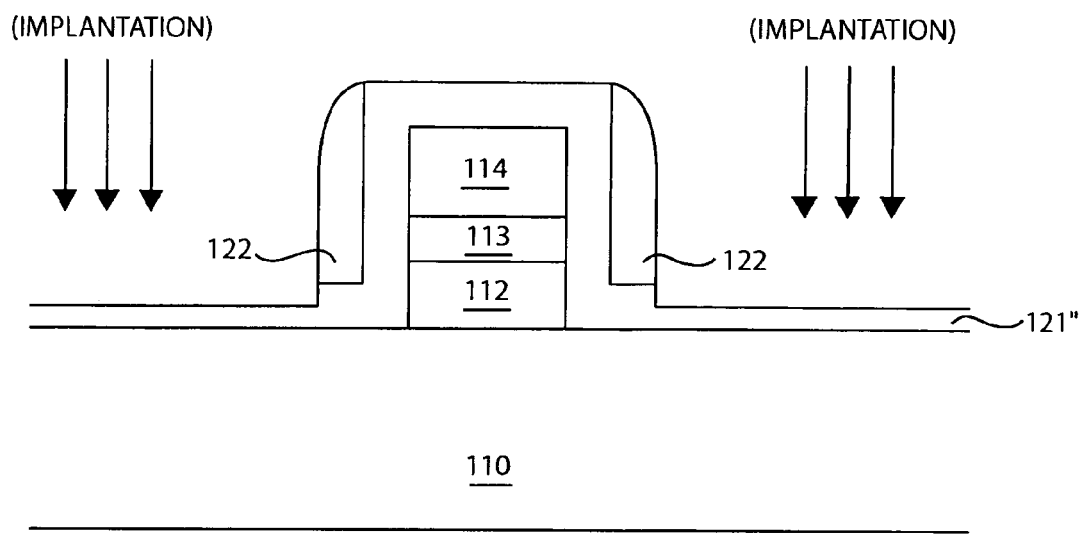

In FIG. 3, dopants are implanted through the thinned first SiN liner 121" to form active device regions. In one embodiment, the active device regions comprise source/drain regions formed by ion implantation through the thinned first SiN liner 121". Implantation through the thinned first SiN liner 121" advantageously helps form shallow junctions. Preferably the first SiN liner 121" comprises or is etched to a thickness of less than about 100 Angstroms prior to implantation.

An annealing step is then performed to activate the source/drain regions formed by ion implantation through the thinned first SiN liner 121". In one embodiment, the annealing step is performed using a rapid thermal anneal (RTA) process.

Figure 4:
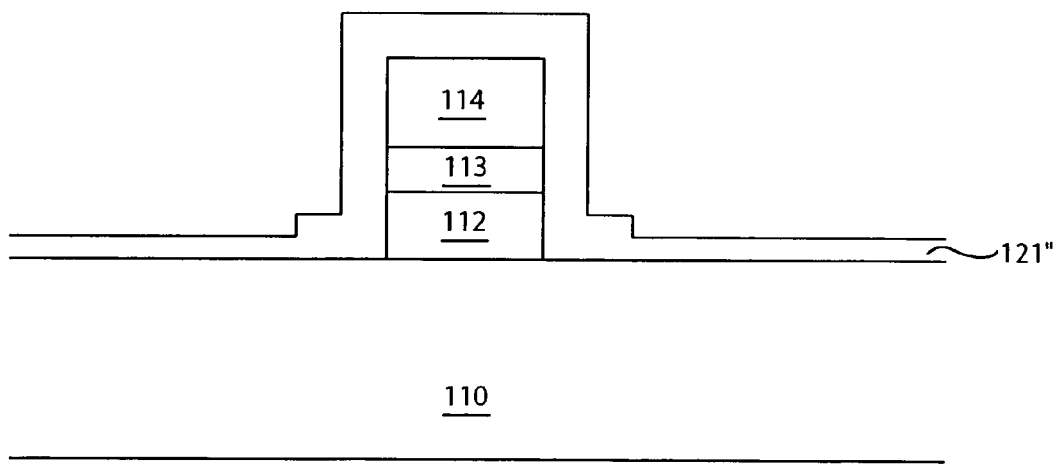

In FIG. 4, the SiO2 layer 122 portion of the composite spacer is removed. The SiO2 layer 122 is also referred to as a "disposable spacer" in that it is removed after the source/drain implantation step. In one embodiment, the $SiO_2$ layer 122 of the composite spacer is removed by a highly isotropic wet or dry etch. As with the composite spacer etch, the $SiO_2$ layer 122 portion of the composite spacer is preferably removed by an etch having a high selectivity to the SiN layer 121". Etching of the $SiO_2$ layer 122 with high selectivity to SiN layer 121" advantageously allows for a substantially rectangular spacer (see FIG. 5). The removal of the $SiO_2$ layer 122 portion of the composite spacer can be accomplished using a hydrofluoric (HF) dip at a concentration of about 100:1, for example.

Figure 5:
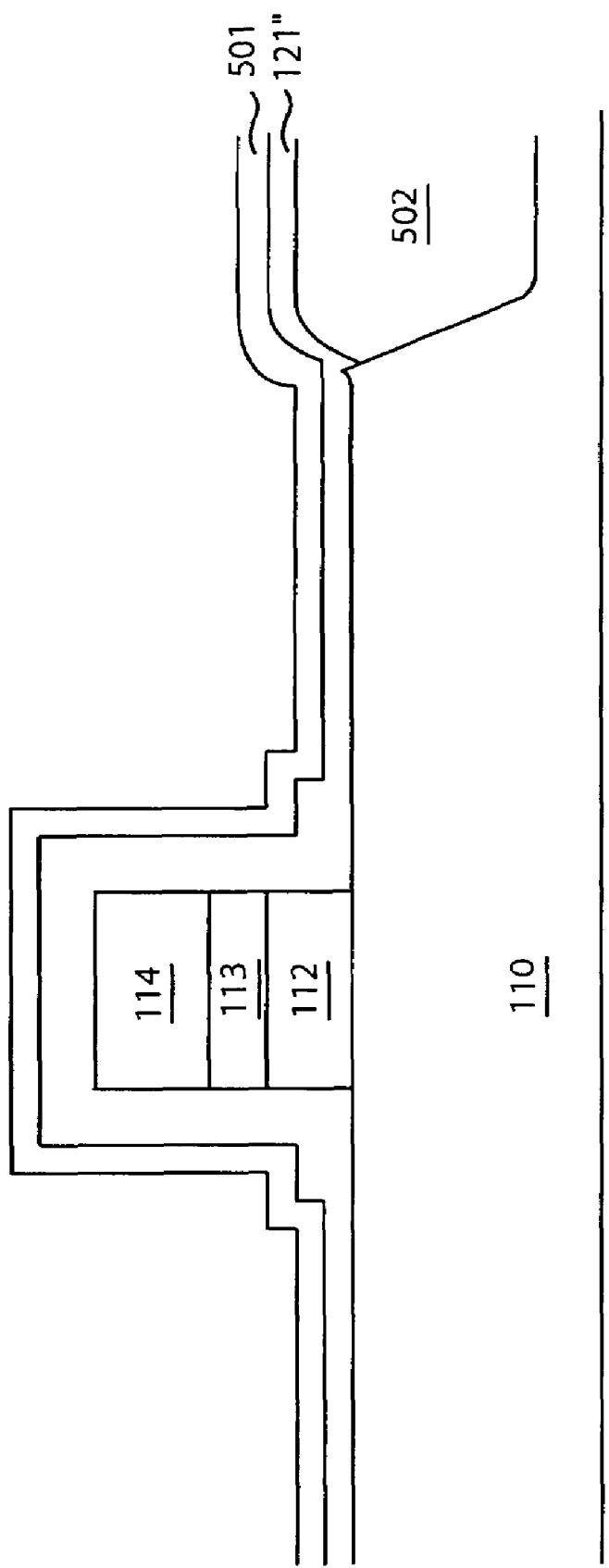

In FIG. 5, a relatively thin second liner comprising a second SiN liner 501 is deposited over the gate and surface of the substrate 110 to form an etch stop over the surface of the substrate 110 according to an embodiment of the present invention. The second SiN liner 501 also advantageously enforces gate protection by creating a substantially rectangular or "boxy" shaped spacer (compare the top corners of the SiO2 layer 122 on the gate in FIG. 2 to those of the second SiN liner 501 in FIG. 5). Preferably, the first SiN liner 121" and the second SiN liner 501 have a total thickness of less than about 350 Å on the sidewalls of the gate and less than 200 Å on the substrate 110, and form a SiN spacer over the gate having a substantially rectangular or 'boxy' cross-section. The resulting spacer retains a substantially rectangular profile despite its thinness. The rectangular spacer comprising the first SiN liner 121" and the second SiN liner 501 advantageously increases self-aligned contact areas and increases the process window for the subsequently deposited pre-metal dielectric by reducing spacer thickness without increasing leakage between the gate and adjoining elements in the completed device due to its substantially rectangular profile. As in the first SiN liner 121, the second SiN liner 501 preferably comprises BTBAS SiN.

Also shown in FIG. 5 is an isolation structure comprising a shallow trench isolation structure (STI) 502, which may be filled with high-density plasma (HDP) deposited $SiO_2$. The second SiN liner 501 advantageously forms an etch stop for the SAC etch of the subsequently deposited pre-metal dielectric, which comprises phosphosilicate glass (PSG) in this example. The use of SiN as an etch stop for the SAC etch eliminates the need for polymerizing chemistries in the SAC etch, which was previously required to stop on an STI 502 filled with HDP deposited $SiO_2$.

Figure 6:
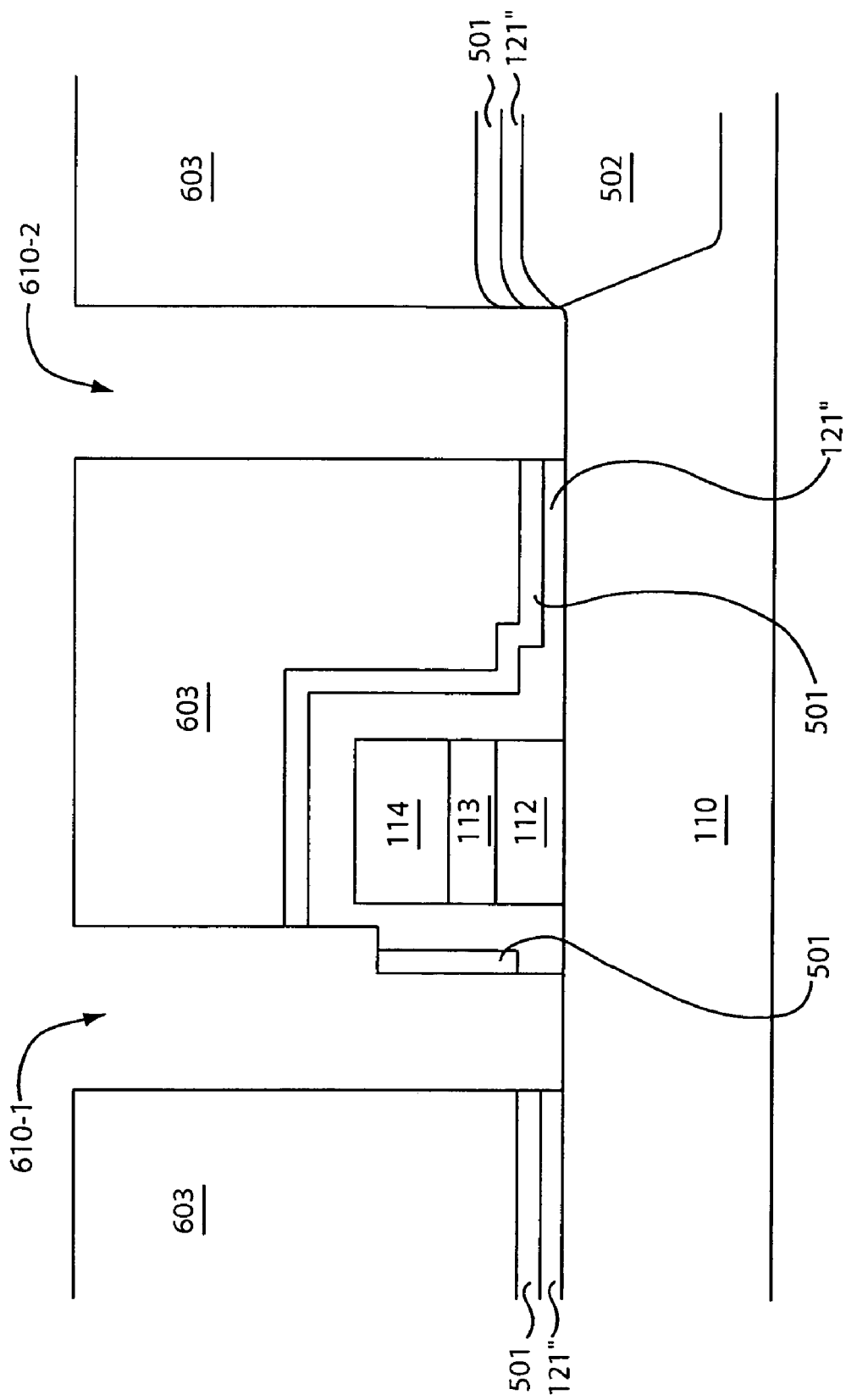

In FIG. 6 a pre-metal dielectric (PMD) 603 is deposited over the gate and the substrate 110, and SAC openings 610 (i.e., 610-1, 610-2) formed therein. The pre-metal dielectric 603 is so named because it forms a dielectric level before the first metal level (not shown; formed over the pre-metal dielectric 603). The pre-metal dielectric 603 can be any suitable dielectric material having the desired electrical and mechanical properties. In one embodiment, the pre-metal dielectric 603 is formed from undoped or lightly doped PSG.

In one embodiment, the pre-metal dielectric 603 is etched in a SAC etch process using the etchant chemistry $C_4F_6/O_2/Ar$ or $C_4F_8/CO/Ar$ using the second SiN liner 501 as an etch stop. The second SiN liner 501 and the first SiN liner 121" are then removed using a $CHF_3/CF_4/Ar$ chemistry. The just mentioned etching of the pre-metal dielectric 603, the first SiN liner 121", and the second SiN liner 501 may be performed in-situ (i.e., without vacuum break). Optionally, the portions of the substrate 110 exposed by the SAC openings 610 are cleaned to remove any etch byproducts and photo resist remaining from the photolithographic process used to form masks for the SAC etch.

In the example of FIG. 6, part of the gate is shown as having been etched during the formation of the SAC opening 610-1. This is to illustrate the self-aligned nature of the SAC openings 610, in that they can be formed somewhat over the gate and still not damage the device. In the event the SAC openings 610 is formed to touch the gate, the capping layer 114 (which comprises silicon nitride in this example) advantageously stops the SAC etch from punching through the metal 113 and destroying the device. The SAC openings 610 may be also formed such that they are not over the gate depending on the SAC etch process window.

Figure 7:
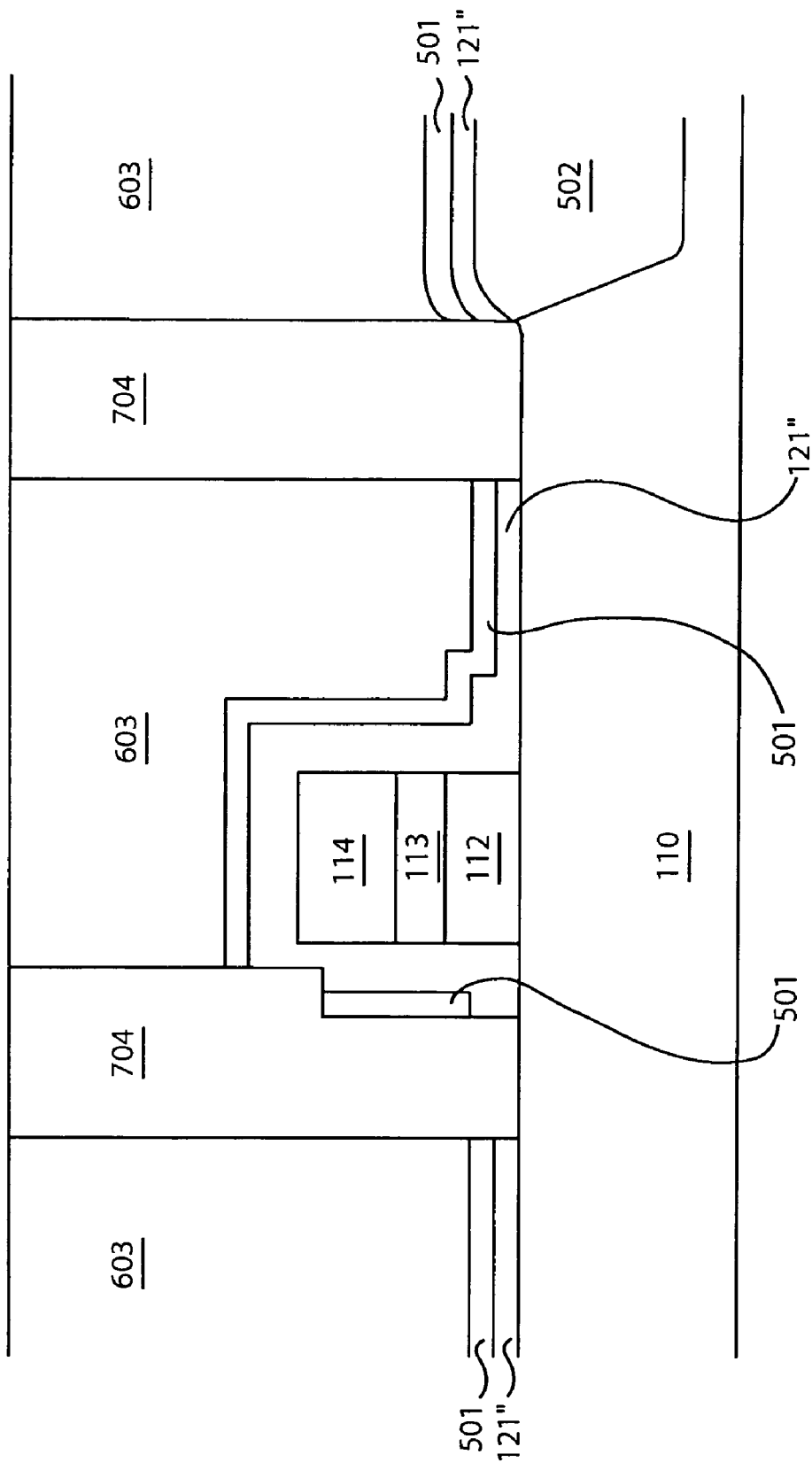

In FIG. 7, SACs 704 are formed through the SAC openings 610 in the pre-metal dielectric 603, and contact the source/drain regions (not shown) on the substrate 110. The SACs 704 may comprise any suitable metal or other conductive material having the desired electrical and mechanical properties. In one embodiment, the SACs 704 comprise a titanium/titanium-nitride (Ti/TiN) liner and a tungsten (W) plug over the Ti/TiN liner. Excess portions of the material of the SACs 704 above the pre-metal dielectric 603 may be planarized or polished using a chemical mechanical planarization or polishing (CMP) process, for example.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents.

What is claimed is:

1. A method of fabricating an integrated circuit, the method comprising:
    forming composite spacers on sidewalls of a transistor gate, each of the composite spacers comprising a first liner having a stepped portion and a disposable spacer material over the stepped portion;
    forming a source/drain region by performing ion implantation through a portion of the first liner over the source/drain region; and
    replacing the disposable spacer material with a second liner formed over the first liner after forming the source/drain region.

2. The method of claim 1 wherein the first and second liners comprise SiN, and the disposable spacer material comprises $SiO_2$.

3. The method of claim 2 wherein the transistor gate comprises a capping layer comprising SiN, the capping layer being configured to protect the transistor gate during a subsequently performed etch of a pre-metal dielectric using the second liner as an etch stop.

4. The method of claim 1 wherein forming the composite spacers on the sidewalls of the transistor gate comprises:
    forming the first liner over the transistor gate and the substrate;
    forming the disposable spacer material over the first liner; and removing portions of the disposable spacer material over a top of the transistor gate and over the substrate where the source/drain regions are subsequently formed.

5. The method of claim 4 wherein removing portions of the disposable spacer material over the top of the transistor gate and over the substrate also thins portions of the first liner over where the source/drain regions are subsequently formed.

6. The method of claim 1 wherein replacing the disposable spacer material with the second liner comprises:
etching all of the disposable spacer material; and
depositing the second liner over the first liner.

7. The method of claim 1 further comprising:
forming a pre-metal dielectric layer over the second liner;
forming an opening through the pre-metal dielectric layer; and
forming a self-aligned contact in the opening to contact the source/drain region.

8. The method of claim 7 wherein the self-aligned contact comprises tungsten.

9. The method of claim 1 wherein the first liner is formed to a thickness less than about 150 Angstroms.

10. The method of claim 1 wherein the first and second liners have a total thickness of less than about 350 Angstroms on a sidewall of the transistor gate.

11. A method of fabricating an integrated circuit, the method comprising:
forming a first liner over a transistor gate, the transistor gate overlying a substrate;
forming a disposable spacer material over the first liner;
etching portions of the disposable spacer material over a top of the transistor gate and over portions of the substrate where source/drain regions are to be formed to form composite spacers on the sidewalls of the transistor gate, and to thin the first liner; and
forming the source/drain regions by implanting through the thinned first liner.

12. The method of claim 11 further comprising:
etching away all of the disposable spacer material;
forming a second liner over the first liner such that a substantially rectangular spacer is formed on the sidewalls of the transistor gate;
forming a pre-metal dielectric over the second liner; and
forming self-aligned contact structures through the pre-metal dielectric to contact the source/drain regions.

13. The method of claim 12 wherein forming the self-aligned contact structures comprises:
forming a plurality of openings through the pre-metal dielectric;
depositing a metal in the openings; and
planarizing portions of the metal over the pre-metal dielectric.

14. The method of claim 13 wherein forming a plurality of openings through the pre-metal dielectric comprises:
etching the pre-metal dielectric to stop on the second liner; and
etching the first and second liners.

15. The method of claim 14 wherein etching the pre-metal dielectric to stop on the second liner is performed using an etchant with a chemistry that includes $C_4F_6$ and $O_2$.

16. The method of claim 14 wherein etching the first and second liners is performed using an etchant that includes $CHF_3$ and $CF_4$.

17. A method of fabricating an integrated circuit, the method comprising:
providing a transistor gate on a surface of a semiconductor substrate;
forming a first silicon nitride (SiN) layer on the transistor gate and on the surface of the semiconductor substrate;
forming a silicon oxide ($SiO2$) layer over the first SiN layer;
etching the $SiO2$ layer to form $SiO2$/SiN spacers on sidewalls of the transistor gate and completely remove portions of the $SiO2$ layer over the first SiN layer on the surface of the semiconductor substrate, and to thin the first SiN layer on the surface of the semiconductor substrate;
implanting dopants through the thinned first SiN layer to form an active device region;
removing the $SiO2$ layer portion of the spacers on the sidewalls of the transistor gate; and
forming a second SiN layer on the first SiN layer to form a SiN etch stop layer over the surface of the semiconductor substrate and to form a substantially rectangular spacer over the transistor gate.

18. The method of claim 17 further comprising:
depositing a pre-metal dielectric (PMD) layer over the second SiN layer;
forming a self-aligned contact (SAC) opening in the PMD layer, wherein the SAC opening stops on the second SiN layer thereby exposing a portion of the second SiN layer;
removing exposed portions of the second SiN layer and then portions of the first SiN layer to expose portions of the active region within the SAC opening; and
filling the SAC opening with a metal to form a SAC in the SAC opening.

* * * * *